United States Patent
Vemulapati et al.

(10) Patent No.: US 11,043,943 B2
(45) Date of Patent: Jun. 22, 2021

(54) SWITCHING OF PARALLELED REVERSE CONDUCTING IGBT AND WIDE BANDGAP SWITCH

(71) Applicant: ABB Power Grids Switzerland AG, Baden (CH)

(72) Inventors: Umamaheswara Vemulapati, Wettingen (CH); Ulrich Schlapbach, Liebefeld (CH); Munaf Rahimo, Uezwil (CH)

(73) Assignee: ABB Power Grids Switzerland AG, Baden (CH)

( * ) Notice: Subject to any disclaimer, the term of this patent is extended or adjusted under 35 U.S.C. 154(b) by 252 days.

(21) Appl. No.: 16/411,716

(22) Filed: May 14, 2019

(65) Prior Publication Data

US 2019/0273493 A1 Sep. 5, 2019

Related U.S. Application Data

(63) Continuation of application No. PCT/EP2017/079125, filed on Nov. 14, 2017.

(30) Foreign Application Priority Data

Nov. 14, 2016 (EP) ..................................... 16198704

(51) Int. Cl.
*H03K 5/08* (2006.01)
*H03K 17/08* (2006.01)
(Continued)

(52) U.S. Cl.
CPC ......... *H03K 17/567* (2013.01); *H03K 17/122* (2013.01); *H03K 17/127* (2013.01);
(Continued)

(58) Field of Classification Search
None
See application file for complete search history.

(56) References Cited

U.S. PATENT DOCUMENTS

| 5,030,844 A | * | 7/1991 | Li | H03K 17/0822 307/135 |
| 5,602,897 A | * | 2/1997 | Kociecki | H05G 1/06 378/101 |

(Continued)

OTHER PUBLICATIONS

European Patent Office, International Search Report & Written Opinion issued in corresponding Application No. PCT/EP2017/079125, dated Dec. 12, 2017, 11 pp.

(Continued)

*Primary Examiner* — Kenneth B Wells
(74) *Attorney, Agent, or Firm* — Slater Matsil, LLP (57) ABSTRACT

A semiconductor module comprises reverse conducting IGBT connected in parallel with a wide bandgap MOSFET, wherein each of the reverse conducting IGBT and the wide bandgap MOSFET comprises an internal anti-parallel diode. A method for operating a semiconductor module with the method including the steps of: determining a reverse conduction start time, in which the semiconductor module starts to conduct a current in a reverse direction, which reverse direction is a conducting direction of the internal anti-parallel diodes; applying a positive gate signal to the wide bandgap MOSFET after the reverse conduction start time; determining a reverse conduction end time based on the reverse conduction start time, in which the semiconductor module ends to conduct a current in the reverse direction; and applying a reduced gate signal to the wide bandgap MOSFET a blanking time interval before the reverse conduction end time, the reduced gate signal being adapted for switching the wide bandgap MOSFET into a blocking state.

20 Claims, 5 Drawing Sheets

(51) Int. Cl.
  *H03K 3/02* (2006.01)
  *H03K 17/16* (2006.01)
  *H03K 17/687* (2006.01)
  *H03K 17/567* (2006.01)
  *H03K 17/12* (2006.01)
  *H03K 17/74* (2006.01)

(52) U.S. Cl.
  CPC ........... *H03K 17/687* (2013.01); *H03K 17/74* (2013.01); *H03K 2217/0036* (2013.01)

(56) References Cited

U.S. PATENT DOCUMENTS

| | | | | |
|---|---|---|---|---|
| 5,610,507 | A * | 3/1997 | Brittan | H03K 17/122 323/272 |
| 5,932,934 | A * | 8/1999 | Hofstetter | H02M 3/158 307/26 |
| 6,353,543 | B2 * | 3/2002 | Itoh | H02M 3/1584 363/131 |
| 7,230,587 | B2 * | 6/2007 | Onozawa | G09G 3/296 315/169.3 |
| 7,372,432 | B2 * | 5/2008 | Lee | G09G 3/296 315/169.4 |
| 7,417,409 | B2 * | 8/2008 | Partridge | H02M 7/48 323/222 |
| 7,741,883 | B2 * | 6/2010 | Fuller | H03K 17/166 327/108 |
| 8,212,283 | B2 | 7/2012 | Storasta et al. | |
| 8,351,231 | B2 * | 1/2013 | Tagome | H02M 1/088 363/71 |
| 8,400,123 | B2 * | 3/2013 | Deboy | H02M 3/1584 323/272 |
| 8,582,331 | B2 * | 11/2013 | Frisch | H03K 17/08142 363/56.02 |
| 8,830,711 | B2 * | 9/2014 | Lai | H03K 17/164 363/98 |
| 8,970,261 | B2 * | 3/2015 | Shiraishi | H01L 27/0617 327/109 |
| 9,030,054 | B2 * | 5/2015 | Jacobson | H03K 17/127 307/115 |
| 9,041,456 | B2 * | 5/2015 | Hasegawa | H01L 23/49562 327/434 |
| 9,276,401 | B2 * | 3/2016 | Rozman | H02H 3/021 |
| 10,033,378 | B2 * | 7/2018 | Turvey | H02M 3/07 |
| 10,050,029 | B2 * | 8/2018 | Shirakawa | H01L 29/66136 |
| 10,263,611 | B2 * | 4/2019 | Steiner | H03K 3/012 |
| 10,886,909 | B2 * | 1/2021 | Baburske | H01L 27/0664 |
| 2013/0257177 | A1 | 10/2013 | Jacobson et al. | |
| 2014/0184303 | A1 | 7/2014 | Hasegawa et al. | |

OTHER PUBLICATIONS

Hoffmann et al., "High Frequency Power Switch—Improved Performance by MOSFETs and IGBTs Connected in Parallel," Power Electronics and Applications, 2005 European Conference on Dresden, Germany, Sep. 11-14, 2005, Piscataway, New Jersey, 11 pp.

* cited by examiner

SWITCHING OF PARALLELED REVERSE CONDUCTING IGBT AND WIDE BANDGAP SWITCH

FIELD OF THE INVENTION

The invention relates to the field of wide bandgap semiconductor switches. In particular, the invention relates to a method for operating a semiconductor module with such a device, a semiconductor module and a half-bridge.

BACKGROUND OF THE INVENTION

Connecting a Si based semiconductor switch and a wide bandgap semiconductor switch in parallel for forming a hybrid switch may have several advantages. For example, such a hybrid switch may have a better performance and lower costs compared to a full wide bandgap semiconductor switch or a full silicon switch with the same current and/or voltage ratings. Furthermore, a parallel arrangement of a Si based IGBT or reverse conducting IGBT with a wide bandgap voltage controlled unipolar semiconductor switch, such as a SiC MOSFET, may provide better thermal performance, conduction performance (i.e. lower conduction losses), switching performance (lower switching losses, higher switching softness) and fault performance (such as improved surge and short-circuit withstand capability). In addition, a hybrid switch combination usually reduces costs, since a minimum number of wide bandgap semiconductor switches may be used, while the performance advantages provided by these switches may be maintained.

For a IGBT (bi-mode IGBT, i.e. a reverse conducting IGBT in combination with an ordinary IGBT on one chip), the so-called MOS gate control technique is known to improve the performance of the semiconductor switch in so-called diode mode. Diode mode may be seen as the operation mode, in which an internal anti-parallel diode of the reverse conducting IGBT is conducting, i.e. a current flows through the reverse conducting IGBT in reverse direction (i.e. current flows from the emitter to the collector) with respect to the ordinary conducting direction of the IGBT (i.e. current flows from the collector to the emitter).

An IGBT is disclosed in U.S. Pat. No. 8,212,283 B2, which document shall be incorporated by reference for the design of an IGBT.

US 2014/184 303 A1 shows a MOSFET with anti-parallel diode, which is connected in parallel with an IGBT. The MOSFET may be a wide-bandgap device and the IGBT may be a reverse conducting IGBT. Both the MOSFET switch and the IGBT switch are controlled with the same gate signal.

US 2013/257 177 A1 shows a MOSFET connected in parallel to an IGBT, which are controlled with different gate signals.

Hoffmann et a., "High Frequency Power Switch—Improved Performance by MOSFETs and IGBTs connected in parallel", Power Electronics and applications, 2005 European Conference on Dresden, Germany, 11-14 Sep. 2005, Piscataway, N.J., USA 11 Sep. 2005 pages 1-11, deals with a hybrid switch composed of a MOSFET and an IGBT, which may be switched differently.

DESCRIPTION OF THE INVENTION

Usually, a semiconductor module carrying both the Si based semiconductor switch and the wide bandgap semiconductor switch comprises a gate driver, which generates the gate signal for the hybrid switch combination. Thus, in MOS gate control, the gate signal for the Si based semiconductor switch is also applied to the wide bandgap semiconductor switch. However, the wide bandgap semiconductor switch may have another behavior as the Si based semiconductor device.

It is an objective of the invention to provide a semiconductor module with a high switching performance and/or with low conduction losses in the diode-mode of operation.

This objective is achieved by the subject-matter of the independent claims. Further exemplary embodiments are evident from the dependent claims and the following description.

Aspects of the invention relate to a semiconductor module and to a method for operating the semiconductor module. A semiconductor module may be any device which electrically interconnects a semiconductor chip with a substrate, provides terminals for electrically connecting the chip and/or mechanically supports the chip.

In particular, the semiconductor module comprises a reverse conducting IGBT, which comprises an internal anti-parallel diode to conduct currents in a reverse direction, and a wide bandgap MOSFET, which also comprises an internal anti-parallel diode. The reverse conducting IGBT and the wide bandgap MOSFET are connected in parallel.

The reverse conducting IGBT and the wide bandgap MOSFET may be bonded to a substrate of the semiconductor module, which also may carry a gate controller, i.e. gate driver, for providing gate signals for the reverse conducting IGBT and the wide bandgap MOSFET.

The reverse conducting IGBT comprises a gate, a collector and an emitter. When a positive gate signal is applied to the gate, a current path between collector and emitter becomes conducting. The reverse current path between the emitter and the collector is always conducting due to the internal anti-parallel diode of the reverse conducting IGBT. For example, the reverse conducting IGBT is a Si based and/or may be an IGBT having an (ordinary) IGBT and a reverse conducting IGBT combined in one chip.

The wide bandgap switch may be based on SiC or GaN, in general, on a chip substrate providing a bandgap of more than 2 eV. For example, the wide bandgap switch may be a MOSFET with a gate, a drain and a source. When a positive gate signal is applied to the gate, a current path between drain and sources becomes conducting. The reverse current path between the source and the drain is always conducting due to an internal anti-parallel body diode of the MOSFET. The wide bandgap switch is connected in parallel to the reverse conducting IGBT and/or anti-parallel to the diode of the reverse conducting IGBT.

It has to be noted that the semiconductor module may be a power semiconductor module, i.e. the reverse conducting IGBT and the wide bandgap MOSFET may be adapted for processing currents of more than 10 A and/or voltages higher than 100 V.

According to an embodiment of the invention, the method comprises the steps of: determining and/or predicting a reverse conduction start time, in which the semiconductor module starts to conduct a current in a reverse direction, which reverse direction is a conducting direction of the internal anti-parallel diode; applying a positive gate signal to the wide bandgap MOSFET after the reverse conduction start time (i.e. in this period, with a positive gate voltage which is higher than a threshold voltage, the MOSFET operates in the third quadrant of a voltage current diagram as a rectifier); determining and/or predicting a reverse conduction end time based on the reverse conduction start time, in which the semiconductor module ends to conduct a current in the reverse direction; and applying a reduced gate signal to the wide bandgap MOSFET a blanking time interval before the reverse conduction end time, the reduced gate signal being adapted for switching the wide bandgap MOSFET into a blocking state.

The reverse conduction end time is based on the reverse conduction start time in such a sense that it may be determined from it either directly or indirectly. For example, the reverse conduction end time may be determined based on the reverse conduction start time and the current switching frequency of the semiconductor module. This may be done by adding a switching frequency dependent offset to the reverse conduction start time. In general, the reverse conduction end time may be predicted based on the reverse conduction start time and optionally further parameters of the semiconductor module. Basically, it has been found that a wide bandgap MOSFET, such as a SiC or GaN based MOSFET, shows the opposite behaviour as a Si based reverse conducting IGBT, i.e., the voltage drop between source and drain in diode mode becomes smaller, when the gate voltage becomes higher. In such a way, for further reducing conduction losses in diode mode, the wide bandgap MOSFET should be switched differently as the reverse conducting IGBT and/or in particular, a higher gate voltage should be applied to the wide bandgap MOSFET, when the wide bandgap MOSFET is in diode mode.

The start time (i.e. the reverse conduction start time) and the end time (i.e. the reverse conduction end time) of the diode mode of the semiconductor module, when a current flows through the internal anti-parallel diode of the reverse conducting IGBT and/or the internal anti-parallel diode of the wide bandgap MOSFET may be determined by the gate controller and/or an external controller, which, for example, also provides the switching signals for the semiconductor module, upon which the gate controller generates the gate signals.

As a further example, the determination of the start time and the end time may be based on measurements of a current across the module. By extrapolating these measurements into the future, a future zero crossing of the current may be determined. Furthermore, the current through the semiconductor module may be determined by the controller, which generates the switching signals, which also may have to predict a future current through the semiconductor module. The controller also may determine the reverse conduction start time from a switching time of a further semiconductor switches interconnected with the parallel connection of the reverse conducting IGBT and the wide bandgap MOSFET. This switching time may be a time at which the further semiconductors switch is turned on. The reverse conduction end time may be determined by the controller from the reverse conduction start time by adding an offset, which may depend on a switching frequency.

In general, the semiconductor module may be in diode mode, when the current through the semiconductor module is negative. Shortly after the current has become negative, for example a predefined time interval after the zero crossing of the current, the gate signal of the wide bandgap MOSFET may be raised to the positive gate signal (i.e. a positive gate voltage). Shortly before the zero crossing, for example a blanking time interval before the zero crossing, before the current becomes positive, the gate signal for the wide bandgap MOSFET may be lowered to the reduced gate signal (i.e. a voltage lower than the positive gate voltage).

In general, a positive gate signal may have a voltage higher than a positive threshold voltage. A reduced gate signal may have a voltage that is lower than the positive gate signal, for example lower than the positive threshold voltage. For example, a reduced gate signal may be substantially 0 V or even may have a negative voltage. The reduced gate signal of the wide bandgap MOSFET is reduced with respect to the positive gate signal of the wide bandgap MOSFET. The reduced gate signal is adapted for switching the wide bandgap MOSFET into a blocking state and/or into an off state. The positive gate signal of the wide bandgap MOSFET is adapted for switching the wide bandgap MOSFET into a conducting state and/or into an on state.

It has to be noted that the voltage of the gate signal may be determined as the voltage between the gate and the source and gate and emitter, respectively.

Also, the gate signal for the reverse conducting IGBT may be shaped, such that the conduction losses of the reverse conducting IGBT are minimized during diode mode. In particular, the gate signal of the reverse conducting IGBT may be kept or set to a reduced voltage during all time or some time of the diode mode.

According to an embodiment of the invention, the positive gate signal is applied to the wide bandgap MOSFET a blanking time interval after the reverse conduction start time. This blanking time interval may have the same length as the blanking time interval before the reverse conduction end time. The positive gate signal may be applied to the wide bandgap MOSFET substantially the complete time, in which a current flows through the anti-parallel channel diode of the wide bandgap MOSFET, i.e., in this period, with a positive gate signal, the MOSFET operates in the third quadrant of a current voltage diagram as a rectifier. The current flows from the source to the drain via the inversion channel and n-base.

According to an embodiment of the invention, a reduced gate signal for the reverse conducting IGBT is maintained between the reverse conduction start time and the reverse conduction end time. A first possibility is to keep the gate signal for the reverse conducting IGBT at a low voltage during the diode mode, such that conduction losses are reduced.

The reduced gate signal of the reverse conducting IGBT is reduced with respect to a positive gate signal of the reverse conducting IGBT. The reduced gate signal is adapted for switching the reverse conducting IGBT into a blocking state and/or into an off state. The positive gate signal of the reverse conducting IGBT is adapted for switching the reverse conducting IGBT into a conducting state and/or into an on state.

According to an embodiment of the invention, the method further comprises: applying a positive gate signal to the reverse conducting IGBT at an extraction time interval prior to the blanking time interval before the reverse conduction end time. A reduced gate signal is applied to the reverse conducting IGBT the blanking time interval before the reverse conduction end time. Alternatively, at the end of the diode mode, the gate signal for the reverse conducting IGBT may be raised to a positive voltage just before the reverse recovery of the diode. This may lead to reduction of the reverse recovery losses of the diode (or of the reverse conducting IGBT in diode-mode). The positive gate signal may help to reduce the plasma (electron-hole pair) in the diode, as the electrons have a low resistive path to the emitter contact via the inversion channel, which results in a reduction in the reverse recovery losses.

Both the blanking time and the extraction time may be in the order of a few 10ths of microseconds.

According to an embodiment of the invention, the blanking time interval is lower than 14 µs, such as 14 µs. The blanking time interval may be used for preventing a shortcut of the semiconductor switches of the semiconductor module with the ones of a further semiconductor module.

According to an embodiment of the invention, the extraction time interval is between 10 µs to 90 µs. For example, the extraction time interval may be between 60 µs and 80 µs for high voltage devices (which may be adapted for processing voltages higher than 3.3 kV). The extraction time interval may be determined based on the amount of charge carriers (plasma) in the n-base of the IGBT which depends on the current and voltage class of the IGBT.

According to an embodiment of the invention, the positive gate signal of the reverse conducting IGBT has a voltage higher than a positive threshold voltage of the reverse conducting IGBT. The gate signal used for switching the reverse conducting IGBT in its conducting state and provided during the extraction time interval may have the same value, such as +15 V.

According to an embodiment of the invention, the positive gate signal of the wide bandgap MOSFET has a voltage higher than a positive threshold voltage of the wide bandgap MOSFET. The gate signal used for switching the wide bandgap MOSFET in its conducting state and provided during most of the diode mode may have the same value, such as +15 V, or higher, such as +20 V.

In general, the positive gate signal applied to the reverse conducting IGBT and the positive gate signal applied to the wide bandgap MOSFET may have the same voltage. However, they also may have different voltage values.

According to an embodiment of the invention, a reduced gate signal of the reverse conducting IGBT is a voltage less than or equal to 0 V and/or is a voltage lower than a threshold voltage of the reverse conducting IGBT. For example, the reduced gate signal may be −15 V.

According to an embodiment of the invention, the reduced gate signal of the wide bandgap MOSFET is a voltage less than or equal to 0 V and/or lower than a threshold voltage of the wide bandgap MOSFET. For example, the reduced gate signal may be −15 V.

In general, the reduced gate signal applied to the reverse conducting IGBT and the reduced gate signal applied to the wide bandgap MOSFET may have the same voltage. However, they also may have different voltage values.

According to an embodiment of the invention, the semiconductor module comprises a reverse conducting IGBT, a wide bandgap MOSFET connected in parallel to the reverse conducting IGBT and a gate controller for providing a gate signal for the reverse conducting IGBT and a different gate signal for the wide bandgap MOSFET. Different gates signals may be signals that have different voltages at a specific time point. These different gate signals may be provided by the gate controller, i.e. gate driver, which may comprise an extra circuit for each semiconductor chip.

According to an embodiment of the invention, the semiconductor module and in particular the gate controller may be adapted for performing the method as described in the above and in the following. For example, the gate controller may determine the reverse conduction start time and the reverse conduction end time and/or may generate the switch signals for the reverse conducting IGBT and the wide bandgap switch based on these times and the blanking time interval (and optionally the extraction time interval), which may be encoded into the gate controller.

A further aspect of the invention relates to a half-bridge comprising two semiconductor modules as described in the above and in the following, which are connected in series. For example, such a half-bridge may be part of an inverter with low switching losses and fast response times with respect to switching signals. The half-bridge may be a semiconductor module, which comprises two switches, wherein each switch is composed of a reverse conducting IGBT and a wide bandgap MOSFET, which are connected in parallel. These two composed switches may be connected in series.

The reverse conduction start time and/or the reverse conduction end time of one of the switches may be determined from switching times of the other switch.

According to an embodiment of the invention, the reverse conduction start time is based on a switching time of another switch, such as a further parallel composition of a reverse conducting IGBT and a wide bandgap MOSFET. For example, the reverse conduction start time may be equal to the switching time of the other switch.

According to an embodiment of the invention, the reverse conduction end time is determined by adding an offset to the reverse conduction start time for the reverse conducting IGBT and the wide bandgap MOSFET. This offset may be determined from a switching frequency of the semiconductor module.

According to an embodiment of the invention, the reverse conduction end time of a first switch composed of a reverse conducting IGBT and a wide bandgap MOSFET is determined by a switching time of another, second switch, which also may be composed of a reverse conducting IGBT and a wide bandgap MOSFET connected in series with the reverse conducting IGBT and the wide bandgap MOSFET of the first switch. For example, the reverse conduction end time of the first switch may be equal to the reverse conduction start time of the second switch.

It has to be understood that features of the method as described in the above and in the following may be features of the semiconductor module, the gate controller and/or the half-bridge as described in the above and in the following, and vice versa.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference

DETAILED DESCRIPTION OF EXEMPLARY EMBODIMENTS

Figure 1:
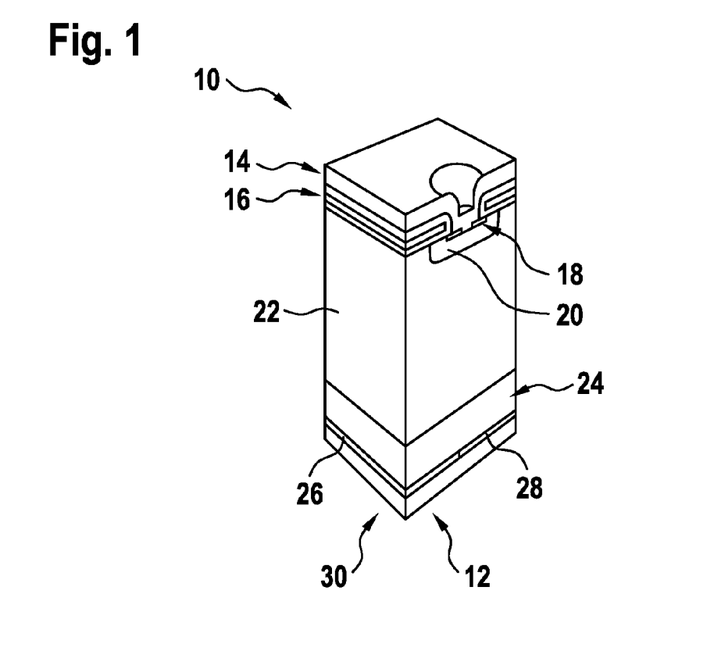
FIG. 1 schematically shows a perspective view of a cell of a reverse conducting IGBT.

FIG. 1 shows a cell of a reverse conducting IGBT (insulated gate bipolar transistor) 10. The reverse conducting IGBT 10 is composed of a plurality of these cells, which are all provided in one chip substrate.

On a first end (collector side), the reverse conducting IGBT 10 comprises a collector 12 in the form of a first planar terminal and on a second end (emitter side) opposing the first end, the reverse conducting IGBT 10 comprises an emitter 14 in the form of a second planar terminal. Further, neighboring the second planar terminal, the reverse conducting IGBT 10 comprises a gate 16 for controlling reverse conducting IGBT 10. Adjacent to the gate 16, an n+-doped region 18 in form of a source layer and a p-doped region 20 in form of a well layer are arranged, which are at least partially embedded in an n-doped base layer 22. The n-base layer 22 adjoins an n+ higher doped buffer layer 24, which in turn adjoins a p-doped region 26 (collector layer) and an n-doped region 28 (shorts) arranged between the n-buffer layer 24 and the first planar terminal 12 forming an internal integrated diode 30 between the collector 12 and the emitter 14 to conduct currents in the reverse direction (i.e. from the emitter 14 to the collector 12).

Figure 2:
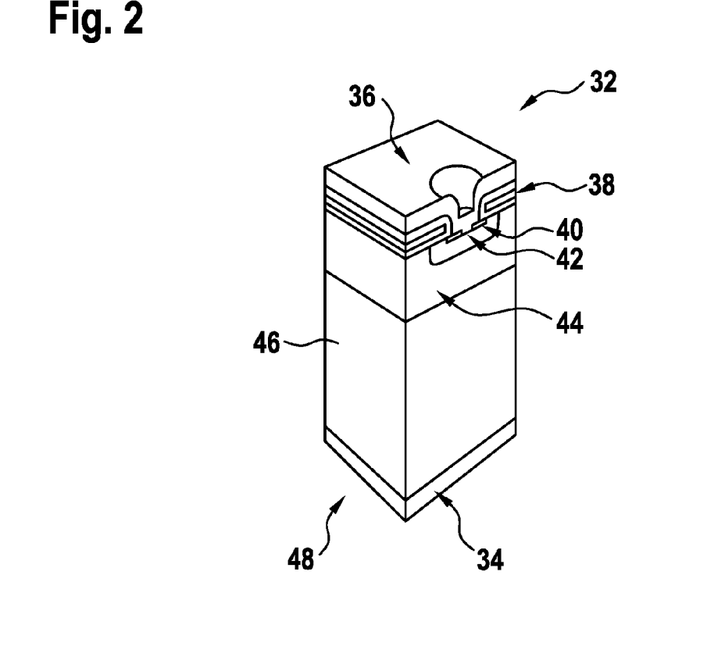
FIG. 2 schematically shows a perspective view of a cell of a SiC MOSFET.

FIG. 2 shows a cell of a SiC MOSFET 32. The SiC MOSFET 32 is composed of a plurality of these cells, which are all provided in one chip substrate.

The SiC MOSFET 32 comprises on a first end a drain 34 in the form of a first planar terminal 34, and on a second end opposing the first end a source 36 in the form of a second planar terminal 36. A gate 38 for controlling the SiC MOSFET 32 neighbors the second planar terminal 36. Adjacent to the gate 38, the SiC MOSFET 32 comprises an n+-doped region 40 and a p-doped region 42, which are at least partially embedded in an n-base layer 44. Between the n-base layer 44 and the first planar terminal 34, an n+-doped layer or n+-doped substrate 46 is arranged.

The SiC MOSFET 32 comprises an internal body diode 48 formed of the layers between the source and the drain.

Figure 3:
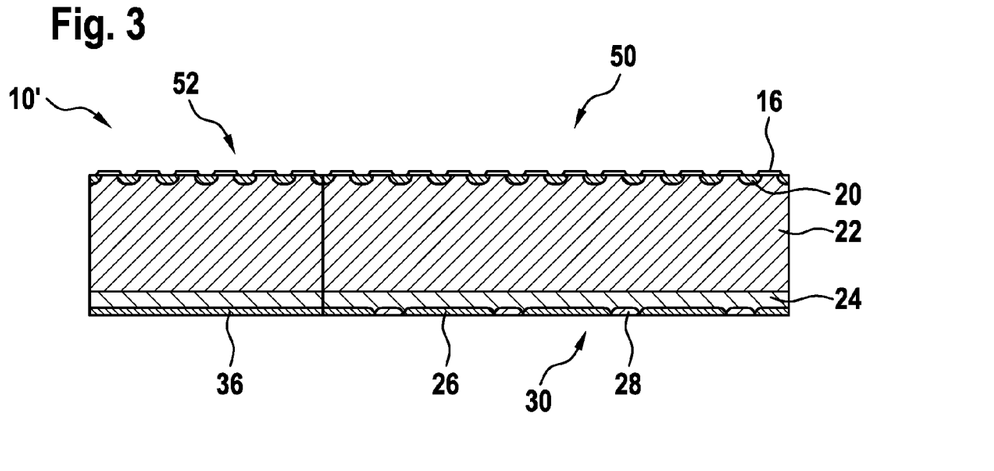
FIG. 3 schematically shows a cross-section through a BIGT.

FIG. 3 shows a cross-section through a BIGT (bi-mode IGBT) 10', which is composed of a reverse conducting IGBT region 50 and an ordinary IGBT region 52 (having a large pilot p doped region 26 in the central part of the device on the collector side). The reverse conducting IGBT region 50 is composed of cells as shown in FIG. 1 (with alternating n and p doped regions 28, 26). The region 52 is composed of cells as the cell of FIG. 1 without the n-doped region 28 (i.e. only with p doped region 26). Exemplarily, the ordinary IGBT region 52 is surrounded by alternating smaller p doped regions 26 and n doped regions 28.

Figure 4:
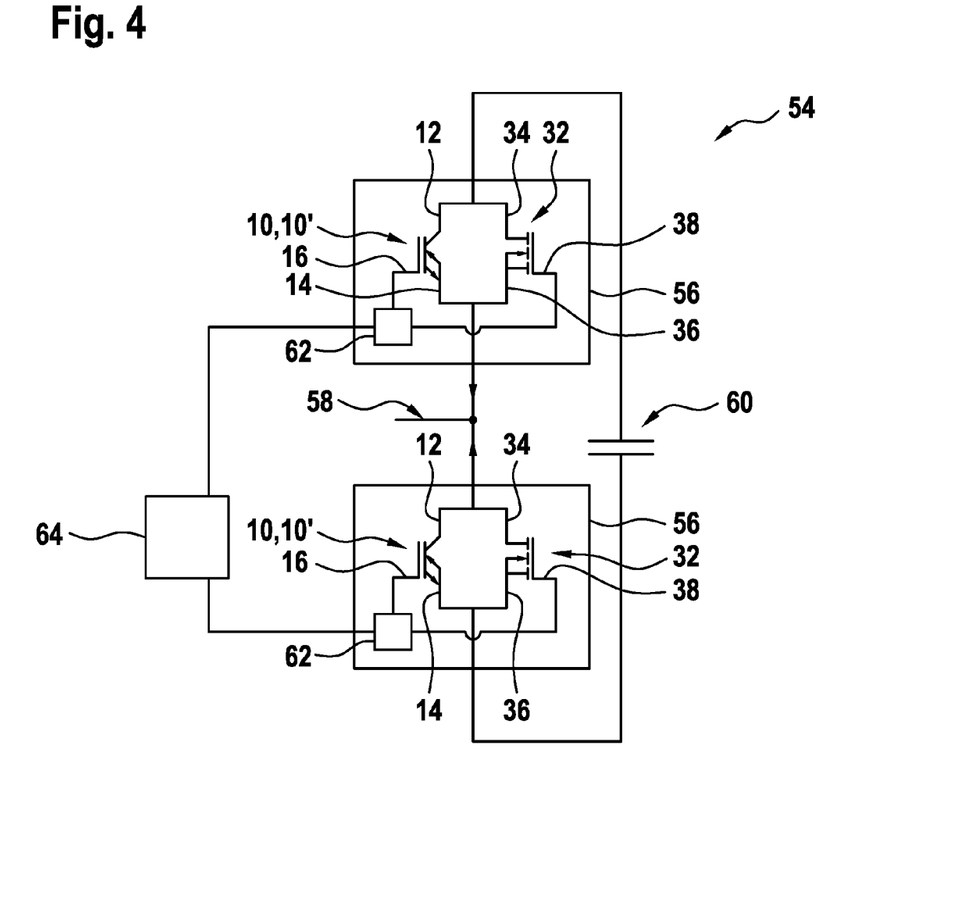
FIG. 4 schematically shows a half-bridge according to an embodiment of the invention.

FIG. 4 shows a half-bridge 54 composed of two semiconductor modules or more general semiconductor modules 56 connected in series. Each of the semiconductor modules 56 provides a controllable switch for connecting a midpoint 58 between the semiconductor modules 56 with a positive or negative voltage of a voltage source 60, such as a DC link.

Each of the semiconductor modules 56 comprises a reverse conducting IGBT 10 or IGBT 10' connected in parallel to a SiC MOSFET 32. Here and in the following, the SiC MOSFET 32 may be replaced with other wide bandgap MOSFET devices based on other wide bandgap semiconductor substrates such as GaN. The semiconductor switches 10, 10', 32 provide with their collector 12 and drain 34 an upper output for the respective semiconductor module 56 and with their emitter 14 and source 36 a lower output for the respective semiconductor module 56. Due to the internal anti-parallel diodes 30, 48, a separate free-wheeling diode is not necessary.

The gates 16, 38 are connected with a gate controller 62 for the respective semiconductor module 56, which is adapted for providing different gate signals for the semiconductor switches 10, 10', 32. For example, the gate controller 62 may be mechanically attached to the same substrate to which the two semiconductor switches 10, 10', 32 are bonded.

The gate controller 62 may receive switching signals from a superordinated controller 64, which, for example, controls an inverter, the half-bridge is a part of. The switching signals of the controller 64 may be transformed into gate signals for the semiconductor switches 10, 10', 32 by the gate controller 62.

Figure 5:
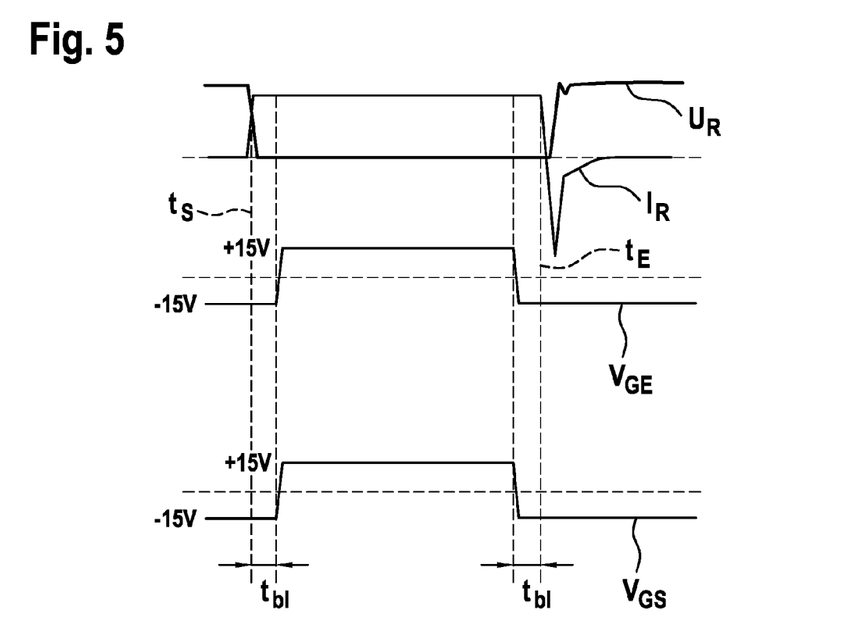
FIG. 5 shows a diagram with gate signals according to an embodiment of the invention.
Figure 6:
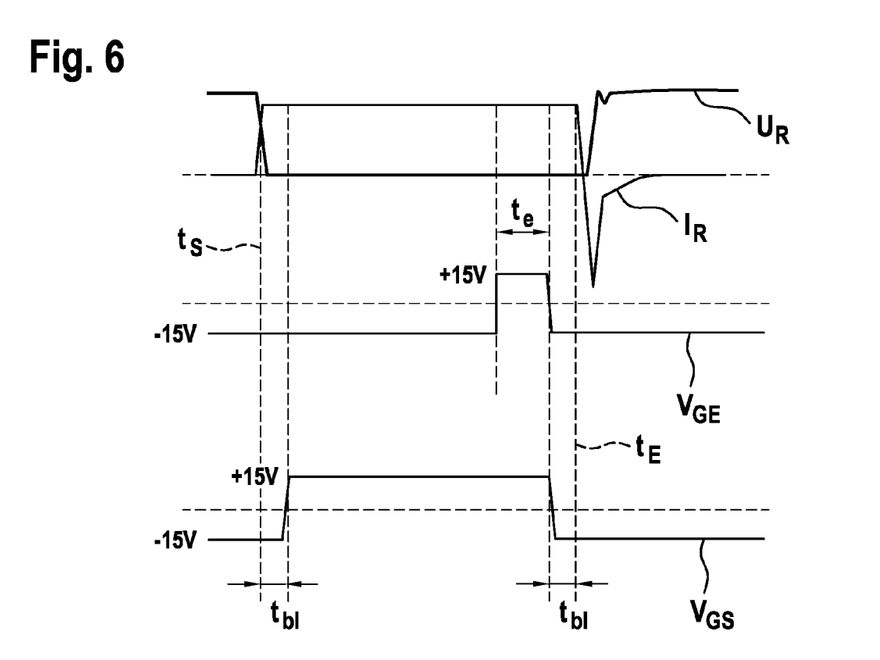
FIG. 6 shows a diagram with gate signals according to a further embodiment of the invention.
Figure 7:
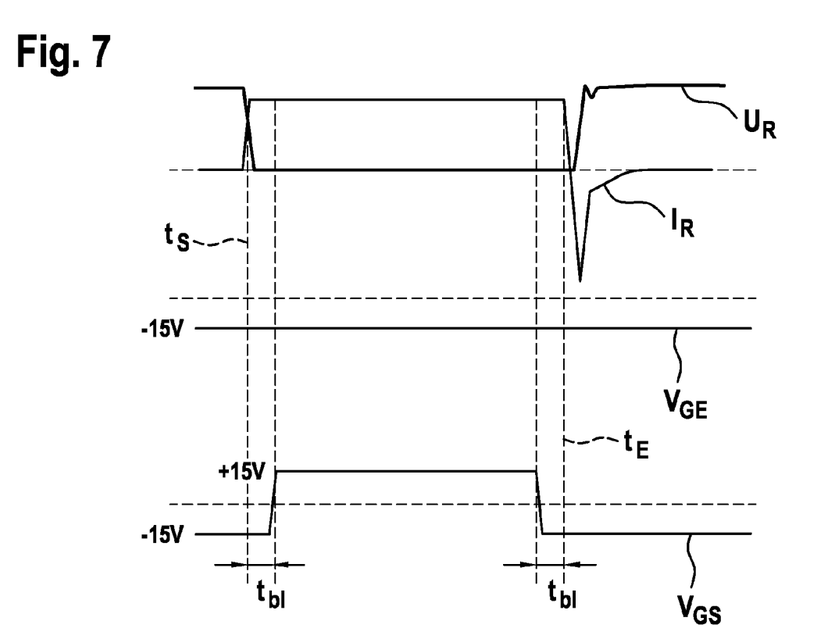
FIG. 7 shows a diagram with gate signals according to a further embodiment of the invention.

FIGS. 5, 6 and 7 show three diagrams with possible gate signals $V_{GE}$ and $V_{GS}$ that may be applied to the reverse conducting IGBT 10, 10' and the wide bandgap MOSFET 32.

The upper part of the diagrams show the voltage $U_R$ at the outputs of the semiconductor module 56, which may be seen as the reverse voltage across the diodes 30, 48. Before a reverse conduction start time $t_S$, the voltage $U_R$ is positive (the voltage is reverse for the diodes 30, 48), since both diodes 30, 48 are blocking. Here, the reverse current $I_R$ flowing through the semiconductor module 56 is 0, i.e. in the direction from the lower output of the semiconductor module 56 (at the emitter and source of the switches 10, 10' and 32) to the upper outputs (at the collector and drain). After a reversal of the voltage applied to the semiconductor module 56, the voltage $U_R$ becomes substantially 0, since the diodes 30, 48 become conducting and a current $I_R$ flows through the semiconductor module 56 in the reverse direction.

This stays substantially the same, until the voltage applied to the semiconductor module 56 changes direction again at a reverse conduction end time $t_E$. After the reverse conduction end time $t_E$, the voltage $U_R$ becomes equal to the voltage applied to the semiconductor module 56, since the diodes 30, 48 block again. For a short time, the reverse current $I_R$ becomes negative, due to a depletion or extraction of charge carriers stored in the n-base or drift region of the switches 10, 10', 32. After that, the reverse current $I_R$ becomes 0, i.e. no current is flowing through the semiconductor module 56.

The reverse conduction start time $t_S$ and the reverse conduction end time $t_E$ may be determined by the gate controller 62 with measurements inside the semiconductor module 56, for example by measuring and extrapolating the voltage across the semiconductor module 56. Since the voltage across the module depends on the switching states of all the semiconductor modules 56 in the half-bridge, it also may be possible that the times $t_S$ and $t_E$ are determined from switching signals from the other semiconductor module 56 by the gate controller 62 and/or the controller 64.

For example, the reverse conduction start time $t_S$ of the lower module or switch 56 of FIG. 4 may be the switching time, when the upper module or switch 56 is switched into an on state. Analogously, the reverse conduction end time $t_E$ of the lower module or switch 56 of FIG. 4 may be the switching time, when the upper module or switch 56 is switched into an off state. The reverse conduction end time $t_E$ of the lower module or switch 56 of FIG. 4 may be the reverse conduction start time $t_S$ of the upper module or switch 56 of FIG. 4 and vice versa. It has to be noted that the method as described herein, which is applied between the reverse conduction start time $t_S$ and the reverse conduction end time $t_E$ is applied to a module or switch 56 in an off state. Additionally, it has to be noted that with the method the reverse conducting IGBT 10 or IGBT 10' and/or the SiC MOSFET 32 may be in a conducting state, although the module or switch 56 composed of them is in an off state, and vice versa.

In all three methods for operating the semiconductor module 56 depicted in FIGS. 5, 6 and 7, the gate signal of the wide bandgap MOSFET 32 is switched to a positive voltage for substantially the complete time interval between the reverse conduction start time $t_S$ and the reverse conduction end time $t_E$.

A positive gate signal $V_{GS}$ is applied to the wide bandgap MOSFET 32 after the reverse conduction start time $t_S$, in particular a blanking time $t_{bl}$ interval after the reverse conduction start time $t_S$. The positive gate signal $V_{GS}$ is maintained before the reverse conduction end time $t_E$, in particular, a blanking time $t_{bl}$ interval after the reverse conduction start time $t_S$. After that, a reduced gate signal $V_{GS}$ is applied to the wide bandgap MOSFET 32 the blanking time interval $t_{bl}$ before the reverse conduction end time $t_E$.

The blanking time intervals $t_{bl}$, which may have the same or different lengths, may have a length of few μs, such as about 10 μs, and/or may be used for preventing a phase-short and/or a shoot-through between different semiconductor modules 56.

The positive gate signal $V_{GS}$, which may be defined by the voltage between gate and source of the wide bandgap MOSFET 32, may be higher than a positive threshold voltage for switching the wide bandgap MOSFET 32, such as +15 V.

The reduced gate signal $V_{GS}$ may be substantially 0 V or less, for example less than a positive threshold voltage of the wide bandgap MOSFET 32, such as −15 V.

The switching of the wide bandgap MOSFET 32 in such a way has the advantage that the conduction losses of the wide bandgap MOSFET 32 and its internal diode 48 are reduced. This will be explained in more detail with respect to FIG. 9.

As shown in FIG. 5, it may be possible that the reverse conducting IGBT 10, 10' is switched analogously to the wide bandgap MOSFET 32.

A positive gate signal $V_{GE}$ is applied to the reverse conducting IGBT 10, 10' after the reverse conduction start time $t_S$, in particular, a blanking time $t_{bl}$ interval after the reverse conduction start time $t_S$. The positive gate signal $V_{GE}$ is maintained before the reverse conduction end time $t_E$, in particular, a blanking time $t_{bl}$ interval after the reverse conduction start time $t_S$. After that, a reduced gate signal $V_{GE}$ is applied to the reverse conducting IGBT 10, 10' the blanking time interval $t_{bl}$ before the reverse conduction end time $t_E$.

The positive gate signal $V_{GE}$, which may be defined by the voltage between gate and emitter of the reverse conducting IGBT 10, 10', may be higher than a positive threshold voltage for switching the reverse conducting IGBT 10, 10', such as +15 V.

The reduced gate signal $V_{GE}$ may be substantially 0 V or less, for example less than a positive threshold voltage of the reverse conducting IGBT 10, 10', such as −15 V.

The control of the reverse conducting IGBT 10, 10' may be called standard control, which however may cause a high on-state voltage drop of the internal diode 30 due to the extraction of the electrons through the inversion channel and hence less plasma inside the device. This behavior will be explained in more detail with respect to FIG. 8.

Contrary to this, in so called MOS gate control, as shown in FIG. 6, a reduced gate signal $V_{GE}$ is applied during most of the time interval between $t_S$ and $t_E$, which usually results in a low on-state voltage drop of the internal diode 30. This behavior will be explained in more detail with respect to FIG. 8.

The reduced gate signal $V_{GE}$ may be maintained until an extraction time interval to and a blanking time interval $t_{bl}$ before the reverse conduction end time $t_E$.

The extraction time interval $t_e$ and the blanking time interval $t_{bl}$ before the reverse conduction end time $t_E$, a positive gate signal $V_{GE}$ is applied to the reverse conducting IGBT 10, 10'. The blanking time $t_{bl}$ interval before the reverse conduction end time $t_E$, a reduced gate signal $V_{GE}$ is again applied to the reverse conducting IGBT 10, 10'.

Thus, during a relatively short time interval $t_e$ shortly before the reverse conduction end time $t_E$, the reverse conducting IGBT is provided with a positive gate signal $V_{GE}$. This does not much contribute to conduction losses (slightly increases) but may reduce reverse recovery losses considerably during turn-off (or reverse recovery) of the internal diode 30. The extraction time interval may have a length of few tens of μs.

As shown in FIG. 7, it may be that the extraction time interval $t_e$ may be completely omitted for the reverse conducting IGBT 10, 10' and/or that the reduced gate signal $V_{GE}$ applied to the reverse conducting IGBT 10, 10' may be maintained. In such a way, a conduction of the internal body diode 48 of the wide bandgap MOSFET 32 during the blanking time interval may be completely suppressed, if the voltage drop of the internal diode 30 of the reverse conducting IGBT 10, 10' may be maintained below 2.5 V at full load current. Before the end time $t_E$, i.e. during the blanking time $t_{bl}$, the channel diode (i.e. the MOSFET operates in the 3$^{rd}$ quadrant meaning current flows from source to drain through the inversion channel) of the wide bandgap MOSFET 32 is off due to the applied gate signal $V_{GS}$ which is below positive threshold voltage and all the load current will flow through the reverse conducting IGBT 10, 10'. Hence, the reliability of the wide bandgap MOSFET 32 may be improved, since internal body diode effect is suppressed and so no bipolar degradation takes place.

Figure 8:
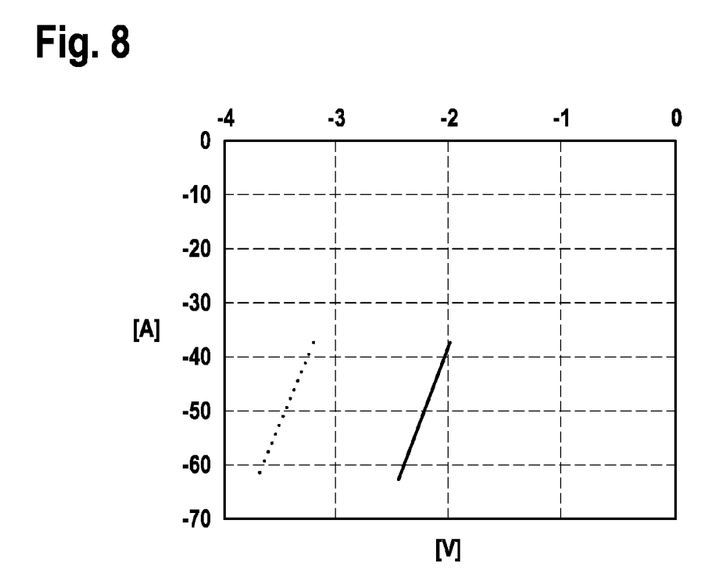
FIG. 8 shows a diagram with characteristic curves for a reverse conducting IGBT or BIGT.

FIG. 8 shows an example of characteristic curves of an IGBT 10' (1.82 cm$^2$ active area) in diode-mode, i.e. during anti-parallel diode conduction. The voltage drop is depicted from right to left, the current through the IGBT 10', i.e. through the internal diode 30, is depicted from top to bottom. The measurements have been conducted at a temperature of 125° C.

At $V_{GE}$=0 V (continuous line, MOS-channel is off), the voltage drop is smaller than at $V_{GE}$=15 V (dotted line, MOS-channel is on). At a rated current of the IGBT 10' of 62.5 A and a temperature 125° C., the voltage drop and therefore the conduction losses can be reduced by 33% with VGE=0 V compared to VGE=15 V.

Figure 9:
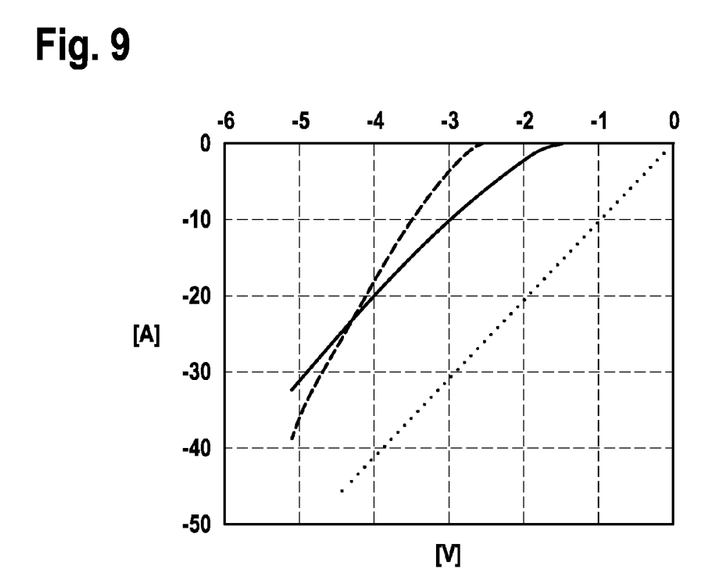
FIG. 9 shows a diagram with characteristic curves for a SiC MOSFET.

FIG. 9 shows a diagram analogous to FIG. 8 for a SiC MOSFET 32 (0.3 cm$^2$ active area) in diode-mode at a temperature of 125° C. The dotted line corresponds to $V_{GS}$=+15 V, the continuous line to $V_{GS}$=0 V and the dashed line to $V_{GS}$=−15 V. At $V_{GS}$=0 V, initially the MOS-channel is off, but due to body-bias effects the MOS channel turns on at $V_{DS}$>−1.5 V. At $V_{GS}$=−15V, the MOS channel is off and the internal body diode conducts. It can be seen that at $V_{GS}$=15V (MOS-channel is on) the on-state voltage drop is smaller than at $V_{GE}$=0 V. At a rated current of 20 A and 125° C., the on-state voltage drop can be reduced by 50% with $V_{GE}$=15 V compared to VGE=0 V.

In general, a reverse conducting IGBT 10, 10' has higher conduction losses for a positive gate signal, whereas as wide bandgap MOSFET 32 has higher conduction losses for a reduced gate signal.

To increase the performance of the reverse conducting IGBT 10, 10' in diode-mode, i.e. mainly during diode conduction, the gate signal $V_{GE}$ may be 0 V or negative (such as −15V or 0V, which may achieve a 33% reduction of conduction losses compared to a positive gate signal (such as $V_{GE}$=15 V), whereas for the wide bandgap MOSFET 32 in diode-mode, the gate signal $V_{GS}$ may be positive (such as +15 V, which may achieve a 50% reduction of conduction losses compared to 0 V or a negative gate signal (such as $V_{GS}$=0 V or −15 V).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS

10 reverse conducting IGBT
10' BIGT
12 collector, first planar terminal
14 emitter, second planar terminal
16 gate
18 n+-doped region
20 p-doped region
22 n-base layer
24 n-buffer layer
26 p-doped region
28 n-doped region
30 reverse conducting diode, internal anti-parallel diode
32 SiC MOSFET
34 drain, first planar terminal
36 source, second planar terminal
38 gate
40 n+-doped region
42 p-doped region
44 n-base layer
46 n+-doped layer
48 reverse conducting diode, internal anti-parallel diode, internal body diode
50 reverse conducting IGBT region
52 ordinary IGBT region
54 half-bridge
56 semiconductor module/composed semiconductor switch
58 midpoint
60 voltage source
62 gate controller
64 superordinated controller
$U_R$ reverse module voltage
$I_R$ reverse module current
$t_S$ reverse conduction start time
$t_E$ reverse conduction end time
$V_{GE}$ gate signal for reverse conducting IGBT
$V_{GS}$ gate signal for wide bandgap MOSFET
$t_{bl}$ blanking time interval
$t_e$ extraction time interval

The invention claimed is:

1. A method for operating a semiconductor module with a reverse conducting IGBT connected in parallel with a wide bandgap MOSFET, wherein each of the reverse conducting IGBT and the wide bandgap MOSFET comprises an internal anti-parallel diode, the method comprising the steps of:
  determining a reverse conduction start time, in which the semiconductor module starts to conduct a current in a reverse direction, which reverse direction is a conducting direction of the internal anti-parallel diodes;
  applying a positive gate signal to the wide bandgap MOSFET after the reverse conduction start time;
  determining a reverse conduction end time based on the reverse conduction start time, in which the semiconductor module ends to conduct a current in the reverse direction, wherein the reverse conduction end time is determined by adding an offset to the reverse conduction start time; and
  applying a reduced gate signal to the wide bandgap MOSFET a blanking time interval before the reverse conduction end time, the reduced gate signal being adapted for switching the wide bandgap MOSFET into a blocking state.

2. The method of claim 1, wherein the positive gate signal is applied to the wide bandgap MOSFET a blanking time interval after the reverse conduction start time.

3. The method of claim 1, wherein a reduced gate signal for the reverse conducting IGBT is maintained between the reverse conduction start time and the reverse conduction end time, the reduced gate signal being adapted for switching the reverse conducting IGBT into a blocking state.

4. The method of claim 1, further comprising:
  applying a positive gate signal to the reverse conducting IGBT an extraction time interval prior to the blanking time interval before the reverse conduction end time;
  applying a reduced gate signal to the reverse conducting IGBT the blanking time interval before the reverse conduction end time.

5. The method of claim 1,
  wherein the blanking time interval is lower than 14 μs.

6. The method of claim 1,
  wherein the extraction time interval is between 10 μs and 90 μs.

7. The method of claim 1,
  wherein the positive gate signal of the reverse conducting IGBT has a voltage higher than a threshold voltage of the reverse conducting IGBT.

8. The method of claim 1,
  wherein the positive gate signal of the wide bandgap MOSFET has a voltage higher than a threshold voltage of the wide bandgap MOSFET.

9. The method of claim 1,
  wherein a reduced gate signal of the reverse conducting IGBT is at least one of:
  a voltage less than or equal to equal 0 V; and
  a voltage lower than a threshold voltage of the reverse conducting IGBT.

10. The method of claim 1,
  wherein the reduced gate signal of the wide bandgap MOSFET is at least one of:

a voltage less than or equal to equal 0 V; and a voltage lower than a threshold voltage of the wide bandgap MOSFET.

11. The method according to claim 1, wherein the reverse conducting IGBT is a Si based BIGT having an IGBT and a reverse conducting IGBT combined in one chip.

12. The method according to claim 1, wherein the wide band-gap MOSFET is based on SiC or GaN.

13. The method of claim 2, wherein a reduced gate signal for the reverse conducting IGBT is maintained between the reverse conduction start time and the reverse conduction end time, the reduced gate signal being adapted for switching the reverse conducting IGBT into a blocking state.

14. The method of claim 2, further comprising:

applying a positive gate signal to the reverse conducting IGBT an extraction time interval prior to the blanking time interval before the reverse conduction end time;

applying a reduced gate signal to the reverse conducting IGBT the blanking time interval before the reverse conduction end time.

15. The method of claim 2, wherein the blanking time interval is lower than 14 μs.

16. The method of claim 2, wherein the extraction time interval is between 10 μs and 90 μs.

17. The method of claim 2, wherein the positive gate signal of the reverse conducting IGBT has a voltage higher than a threshold voltage of the reverse conducting IGBT.

18. The method of claim 2, wherein the positive gate signal of the wide bandgap MOSFET has a voltage higher than a threshold voltage of the wide bandgap MOSFET.

19. A semiconductor module, comprising:

a reverse conducting IGBT with an internal anti-parallel diode;

a wide bandgap MOSFET connected in parallel with the reverse conducting IGBT, the wide bandgap MOSFET having an internal anti-parallel diode; and a controller for providing a gate signal for the reverse conducting IGBT and a different gate signal for the wide bandgap MOSFET;

wherein the semiconductor module is configured for performing the following operations based on processing by the controller:

determine a reverse conduction start time, in which the semiconductor module starts to conduct a current in a reverse direction, which reverse direction is a conducting direction of the internal anti-parallel diodes;

apply a positive gate signal to the wide bandgap MOSFET after the reverse conduction start time;

determine a reverse conduction end time based on the reverse conduction start time, in which the semiconductor module ends to conduct a current in the reverse direction, wherein the reverse conduction end time is determined by adding an offset to the reverse conduction start time; and apply a reduced gate signal to the wide bandgap MOSFET a blanking time interval before the reverse conduction end time, the reduced gate signal being adapted for switching the wide bandgap MOSFET into a blocking state.

20. A half bridge comprising two semiconductor modules according to claim 19 in series.

* * * * *